(12) United States Patent
Sekine et al.

(10) Patent No.: US 7,928,500 B2
(45) Date of Patent: Apr. 19, 2011

(54) SEMICONDUCTOR DEVICE

(75) Inventors: Katsuyuki Sekine, Yokohama (JP); Yoshio Ozawa, Yokohama (JP); Hiroaki Tsunoda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 12/275,995

(22) Filed: Nov. 21, 2008

(65) Prior Publication Data
US 2009/0134446 A1   May 28, 2009

(30) Foreign Application Priority Data
Nov. 22, 2007  (JP) .................................. 2007-303302

(51) Int. Cl.
*H01L 29/788* (2006.01)
(52) U.S. Cl. ............... 257/321; 257/E29.17; 257/E29.3; 257/E29.168
(58) Field of Classification Search .................. 257/321, 257/E29.17, E29.168, E29.3; 977/943
See application file for complete search history.

(56) References Cited

U.S. PATENT DOCUMENTS

| | | | | |
|---|---|---|---|---|
| 4,688,078 A * | 8/1987 | Hseih | | 257/321 |
| 5,989,958 A * | 11/1999 | Forbes | | 438/257 |
| 6,690,059 B1 * | 2/2004 | Lojek | | 257/316 |
| 6,740,928 B2 | 5/2004 | Yoshii et al. | | |
| 7,595,528 B2 * | 9/2009 | Duan et al. | | 257/321 |
| 7,619,274 B2 * | 11/2009 | Mitani et al. | | 257/315 |
| 2002/0185674 A1 * | 12/2002 | Kawashima et al. | | 257/315 |
| 2006/0118853 A1 * | 6/2006 | Takata et al. | | 257/314 |
| 2007/0155099 A1 * | 7/2007 | Takata et al. | | 438/257 |
| 2008/0062757 A1 * | 3/2008 | Forbes | | 365/182 |
| 2008/0121978 A1 | 5/2008 | Sawamura | | |
| 2009/0262583 A1 * | 10/2009 | Lue | | 365/185.28 |
| 2010/0112195 A1 * | 5/2010 | Kodas et al. | | 427/98.4 |

FOREIGN PATENT DOCUMENTS
JP   05-129625   5/1993
* cited by examiner

*Primary Examiner* — Allan R Wilson
(74) *Attorney, Agent, or Firm* — Finnegan, Henderson, Farabow, Garrett & Dunner, L.L.P.

(57) ABSTRACT

A semiconductor device includes a tunnel insulating film formed on a semiconductor substrate, a floating gate electrode formed on the tunnel insulating film, an inter-electrode insulating film formed on the floating gate electrode, and a control gate electrode formed on the inter-electrode insulating film, wherein the inter-electrode insulating film includes a main insulating film and a plurality of nano-particles in the main insulating film.

16 Claims, 8 Drawing Sheets

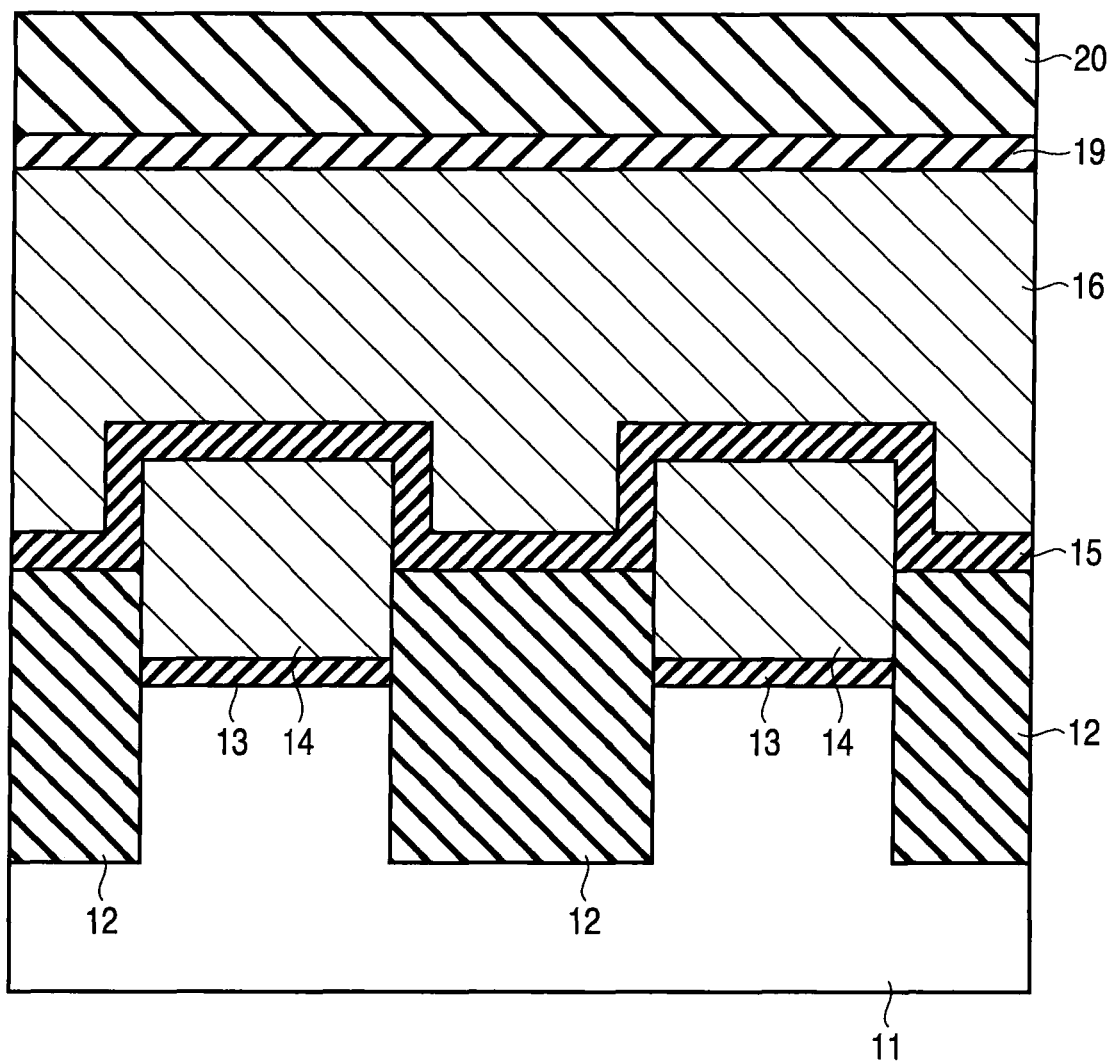
F I G. 1

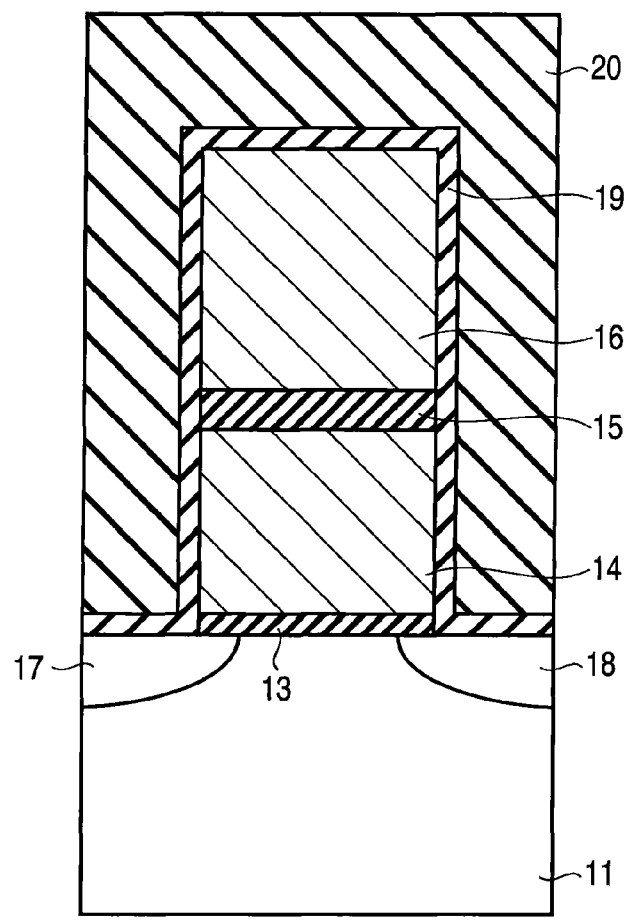
F I G. 2
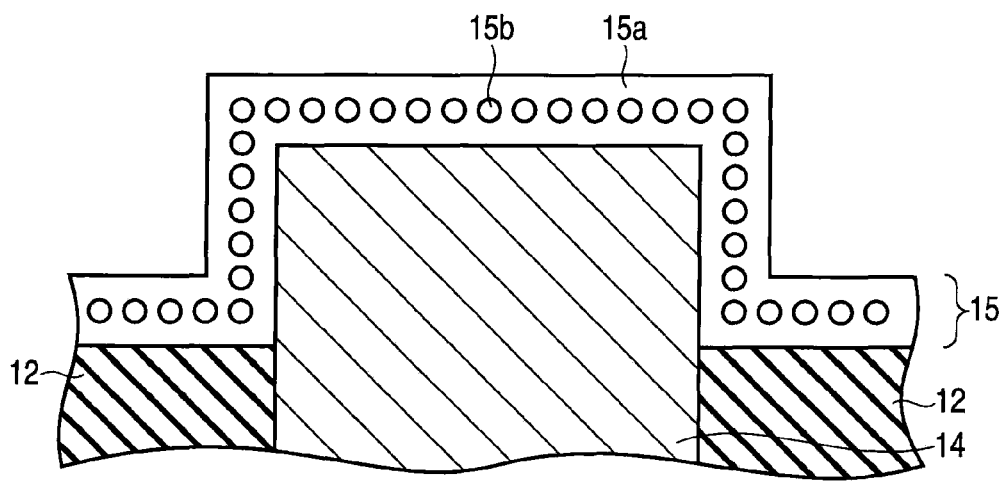
F I G. 3

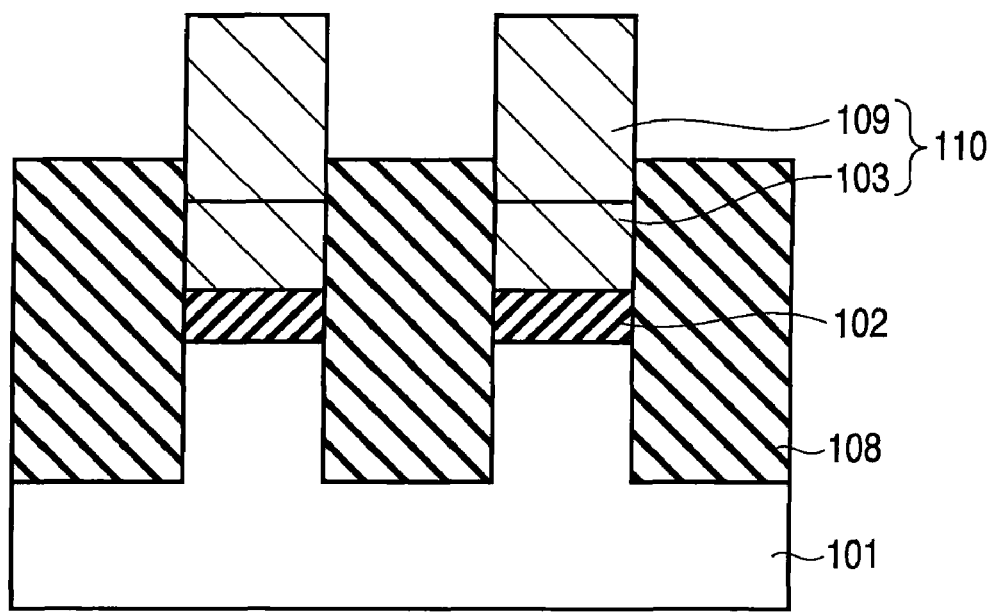
F I G. 11
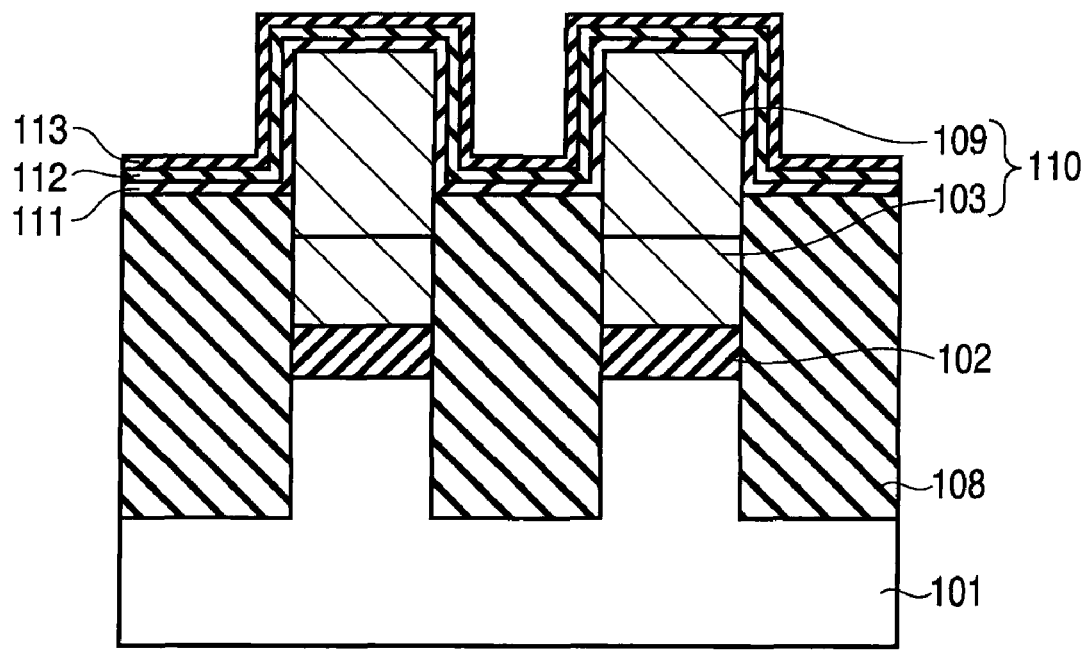
F I G. 12

SEMICONDUCTOR DEVICE

CROSS-REFERENCE TO RELATED APPLICATIONS

This application is based upon and claims the benefit of priority from prior Japanese Patent Application No. 2007-303302, filed Nov. 22, 2007, the entire contents of which are incorporated herein by reference.

BACKGROUND OF THE INVENTION

1. Field of the Invention

The present invention relates to a semiconductor device.

2. Description of the Related Art

In recent years, various proposals about nonvolatile memories have been made (for example, see Jpn. Pat. Appln. KOKAI Publication No. 5-129625). In the nonvolatile memory, in order to secure a sufficient charge retention characteristic, it is important to minimize a leakage current as much as possible.

However, in a conventional nonvolatile memory, it cannot be said that a leakage current though an inter-electrode insulating film is always sufficiently suppressed.

BRIEF SUMMARY OF THE INVENTION

An aspect of the present invention, there is provided a semiconductor device comprising: a tunnel insulating film formed on a semiconductor substrate; a floating gate electrode formed on the tunnel insulating film; an inter-electrode insulating film formed on the floating gate electrode; and a control gate electrode formed on the inter-electrode insulating film, wherein the inter-electrode insulating film includes a main insulating film and a plurality of nano-particles in the main insulating film.

BRIEF DESCRIPTION OF THE SEVERAL VIEWS OF THE DRAWING

FIG. 1 is a sectional view showing a configuration of a semiconductor device according to an embodiment of the present invention;

FIG. 2 is a sectional view showing a configuration of the semiconductor device according to the embodiment of the present invention;

FIG. 3 is a sectional view showing a detailed configuration of an inter-electrode insulating film according to the embodiment of the present invention;

FIGS. 7 to 14 are sectional views showing a method of manufacturing a semiconductor device according to the embodiment of the present invention.

DETAILED DESCRIPTION OF THE INVENTION

Figure 4:
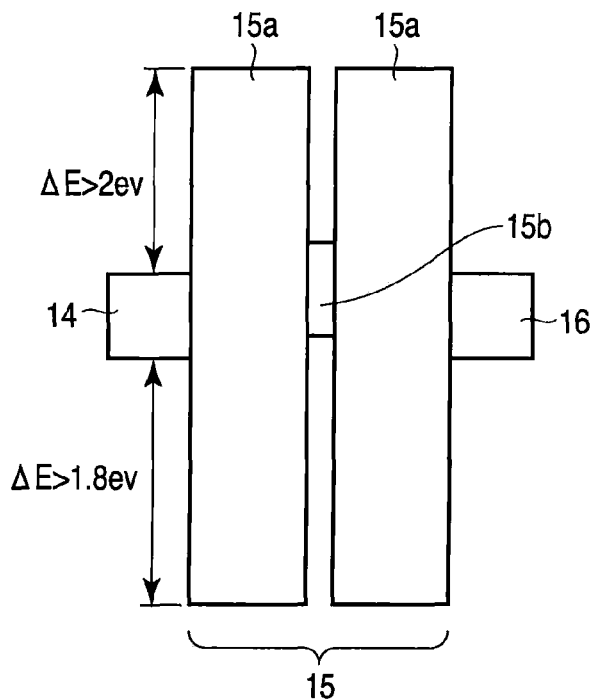
FIG. 4 is a diagram showing an energy band obtained when nano-particles made of a semiconductor are used in the embodiment of the present invention.

An embodiment of the present invention will be described below with reference to the accompanying drawings.

FIGS. 1 and 2 are sectional views showing a configuration of a semiconductor device (nonvolatile semiconductor memory device), mainly a memory cell transistor, according to the embodiment of the invention. FIG. 1 is a sectional view in a channel width direction (word line direction), and FIG. 2 is a sectional view in a channel length direction (bit line direction).

As shown in FIGS. 1 and 2, an isolation insulating region 12 is formed in a surface region of a semiconductor substrate (silicon substrate) 11, and a memory cell transistor is formed in an element forming region surrounded by the isolation insulating region 12.

The memory cell transistor includes a tunnel insulating film 13 formed on the semiconductor substrate 11, a floating gate electrode 14 formed on the tunnel insulating film 13, an inter-electrode insulating film 15 formed on the floating gate electrode 14, and a control gate electrode 16 formed on the inter-electrode insulating film 15. A source region 17 and a drain region 18 are formed in a surface region of the element forming region, and a region between the source region 17 and the drain region 18 serves as a channel region. The memory cell transistor is covered with an insulating film 19, and an interlayer insulating film 20 is formed on the insulating film 19.

FIG. 3 is a sectional view showing a detailed configuration of the inter-electrode insulating film 15. As shown in FIG. 3, the inter-electrode insulating film 15 includes a main insulating film 15a and a plurality of nano-particles 15b which are present in the main insulating film 15a. The plurality of nano-particles 15b are isolated from each other, and each of the nano-particles 15b is surrounded by the main insulating film 15a.

The nano-particles 15b are generally formed of nano-crystals, and particle diameters of the nano-particles 15b are about 5 nm or less. The nano-particles 15b are made of a semiconductor, an insulator, or a conductor (metal or the like). The main insulating film 15a is generally amorphous, and is made of an insulating film having a low charge trap density. The main insulating film 15a functions as a potential barrier to carriers (electrons and holes) trapped by the nano-particles 15b.

FIG. 4 is a diagram showing an energy band obtained when the nano-particles 15b made of a semiconductor is used. As the floating gate electrode 14 and the control gate electrode 16, polysilicon films are used. As shown in FIG. 4, a potential barrier (potential barrier to a conduction band end of silicon used for the floating gate electrode 14 and the control gate electrode 16) of the main insulating film 15a to electron is preferably 2 eV or more. A potential barrier (potential barrier to a valence band end of silicon used for the floating gate electrode 14 and the control gate electrode 16) of the main insulating film 15a to hole is preferably 1.8 eV or more. An electron affinity of a semiconductor used for the nano-particles 15b is preferably 3.5 eV or more.

Even though the nano-particles 15b made of a metal in place of a semiconductor are used, the main insulating film 15a also preferably satisfies the above relations. In this case, a work function of the metal is preferably 3.5 eV or more.

Figure 5:
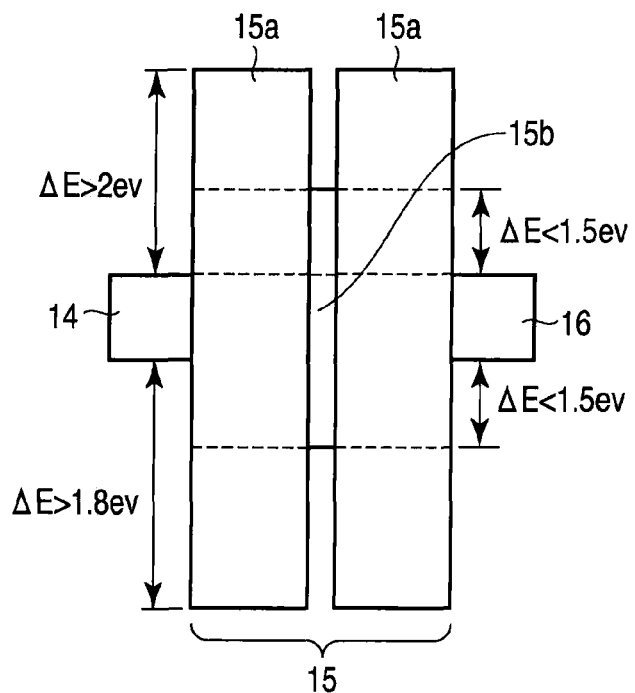
FIG. 5 is a diagram showing an energy band obtained when nano-particles made of an insulator are used in the embodiment of the present invention.

FIG. 5 is a diagram showing an energy band obtained when using the nano-particles 15b made of an insulator. As the floating gate electrode 14 and the control gate electrode 16, polysilicon films are used. As shown in FIG. 5, the main insulating film 15a preferably satisfies the same relations as in FIG. 4. A potential barrier (potential barrier to a conduction band end of silicon used for the floating gate electrode 14 and the control gate electrode 16) of the nano-particles 15b formed of an insulator to electron is preferably 1.5 eV or less.

A potential barrier (potential barrier to a valence band end of silicon used for the floating gate electrode 14 and the control gate electrode 16) of the nano-particles 15b formed of an insulator to hole is preferably 1.5 eV or less.

More specifically, as the main insulating film 15a, for example, a silicon oxide film, a silicon nitride film, a silicon oxynitride film, or an aluminum oxide film ($Al_2O_3$ film) can be used. A stack film formed of an arbitrary combination of these films can also be used.

As a semiconductor used for the nano-particles 15b, for example, silicon (Si), germanium (Ge), or SiGe can be used. An impurity element such as B, Al, In, P, As, or Sb may be doped in the semiconductor.

As a metal used for the nano-particles 15b, for example, Hf, Zr, Ti, or Ta can be used.

As an insulator used for the nano-particles 15b, for example, a metal oxide, a metal nitride, or a metal oxynitride can be used. For example, a hafnium silicon oxide, a hafnium silicon oxynitride, a hafnium aluminum oxide, a hafnium oxide, a zirconium oxide, a titanium oxide, a tantalum oxide, or the like can be used. More specifically, HfSiO, HfSiON, HfAlO, $HfO_2$, $ZrO_2$, $TiO_2$, $Ta_2O_5$, or the like can be used.

As described above, according to the embodiment, the inter-electrode insulating film 15 includes the main insulating film 15a and the nano-particles 15b which are present in the main insulating film 15a. As a result, in the embodiment, a nonvolatile memory device which can sufficiently suppress a leakage current through the inter-electrode insulating film and which is excellent in characteristic and reliability can be obtained.

More specifically, in the embodiment, the nano-particles 15b which are present in the main insulating film 15a function as charge traps. For this reason, by a potential barrier obtained by trapped charges (especially, electrons), moving of charges (especially, electrons) from the floating gate electrode 14 to the control gate electrode 16 is suppressed. Moving of the trapped charges is suppressed by a potential barrier (for example, the potential barriers shown in FIGS. 4 and 5) of the main insulating film 15a. Therefore, according to the embodiment, charges accumulated in the floating gate electrode 14 can be prevented from moving, and deterioration of a charge retention characteristic caused by a leakage current can be sufficiently suppressed.

In the embodiment, since the nano-particles 15b are isolated from each other, as will be described below, a leakage current between adjacent memory cell transistors can be suppressed. When an interval between the adjacent memory cell transistors becomes short with miniaturization of a nonvolatile memory device, a lateral leakage current flowing through the inter-electrode insulating film 15 between the adjacent memory cell transistors becomes unignorable problem. In the example in FIG. 1, a lateral leakage current flowing through the inter-electrode insulating film 15 formed on the isolation insulating region 12 is serious problem. In the embodiment, since the nano-particles 15b are isolated from each other, moving of charges trapped by the nano-particles 15b is blocked by the surrounding main insulating film 15a. As a result, a lateral leakage current flowing through the inter-electrode insulating film 15 between the adjacent memory cell transistors can be suppressed.

A density of the nano-particles 15b in a film thickness direction of the inter-electrode insulating film 15 at a central portion of the inter-electrode insulating film 15 is preferably higher than those near the upper surface and the lower surface of the inter-electrode insulating film 15. More specifically, the nano-particles 15b are preferably concentrated at a position near the central portion of the inter-electrode insulating film 15 in the film thickness direction. When the nano-particles 15b are present at the central portion of the inter-electrode insulating film 15 in the film thickness direction, a distance between the nano-particles 15b and the upper surface of the inter-electrode insulating film 15 and a distance between the nano-particles 15b and the lower surface of the inter-electrode insulating film 15 can be made long. For this reason, the charges trapped by the nano-particles 15b can be more reliably held, and the leakage current can be more reliably suppressed.

Figure 6:
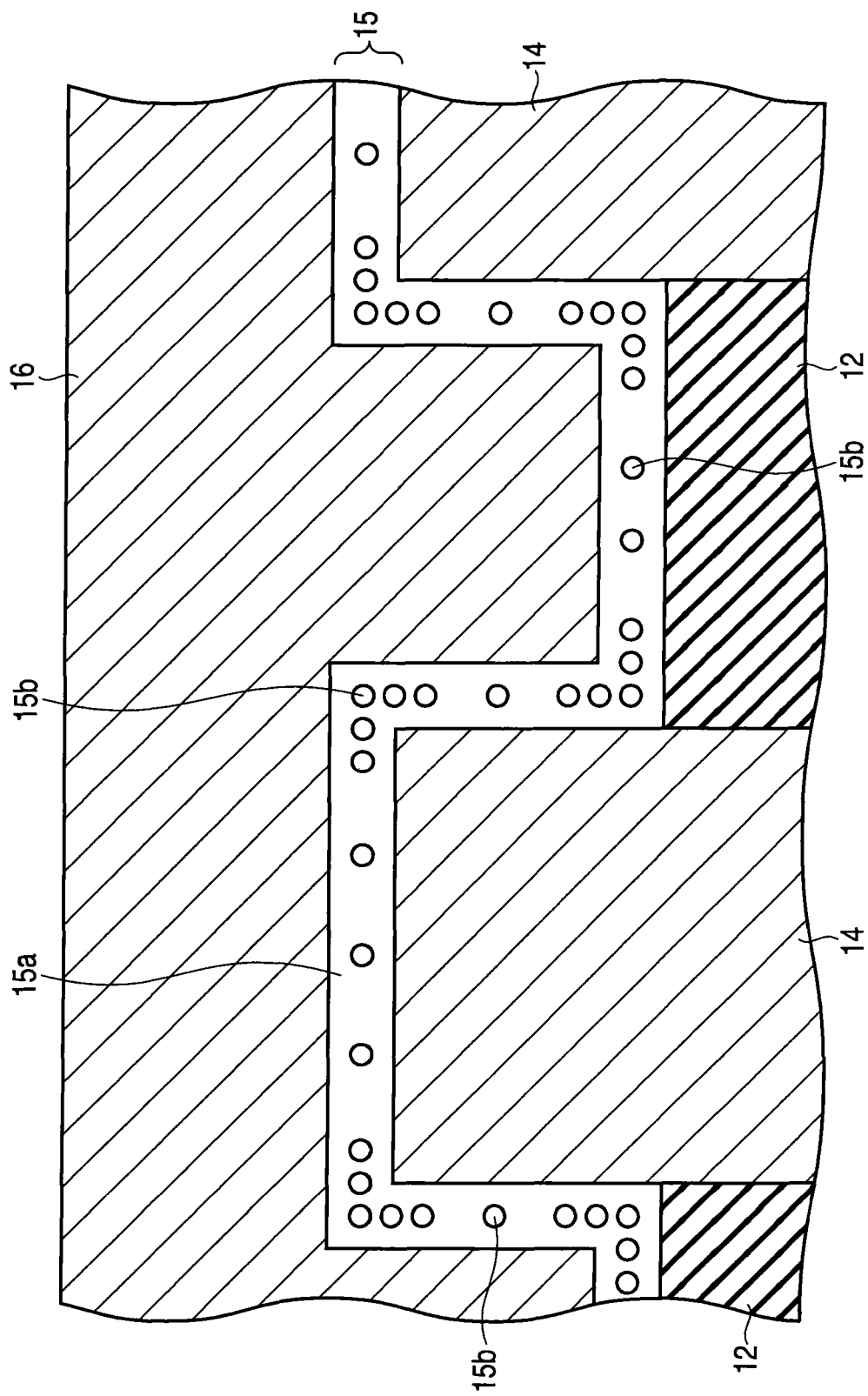
FIG. 6 is a sectional view showing a configuration example of an inter-electrode insulating film in the embodiment of the present invention.

As shown in FIG. 6, a density of the nano-particles 15b at a corner of the inter-electrode insulating film 15 is preferably higher than a density of the nano-particles 15b at a portion other than the corner of the inter-electrode insulating film 15. More specifically, since an electric field is concentrated at the corner, a leakage current is generated at the corner more easily than at the portion other than the corner. When the density of the nano-particles 15b is made high at the corner, the leakage current can be effectively reduced.

A method of manufacturing a semiconductor device according to the embodiment will be described below. FIGS. 7 to 14 are sectional views showing the method of manufacturing a semiconductor device (nonvolatile semiconductor memory device) according to the embodiment.

Figure 7:
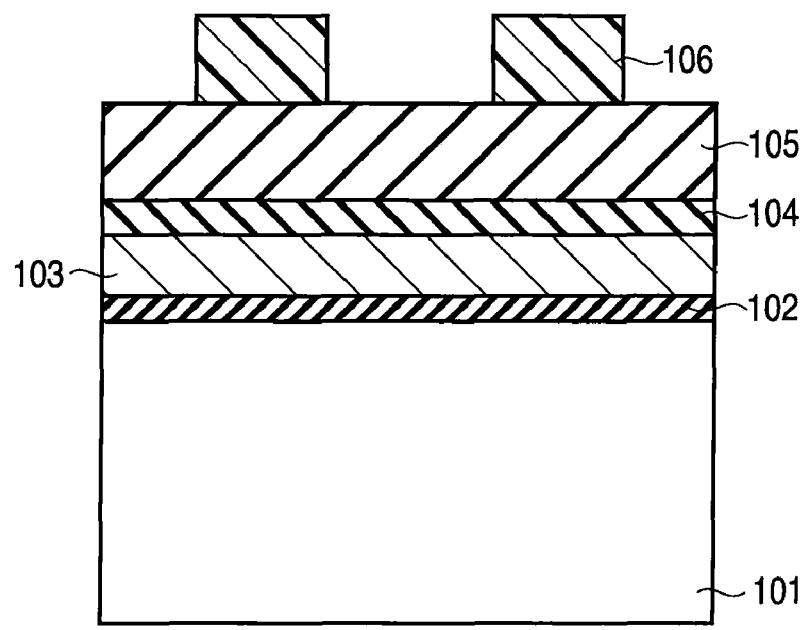

As shown in FIG. 7, a tunnel insulating film 102 having a thickness of about 1 to 15 nm is formed on a semiconductor substrate (silicon substrate) 101. Subsequently, on the tunnel insulating film 102, a polysilicon film 103 having a thickness of about 10 to 200 nm is formed by CVD (chemical vapor deposition). The polysilicon film 103 serves as a part of a floating gate electrode film (lower layer portion of a floating gate electrode film). Subsequently, a silicon nitride film 104 having a thickness of about 50 to 200 nm is formed on the polysilicon film 103 by CVD. Furthermore, a silicon oxide film 105 having a thickness of about 50 to 400 nm is formed on the silicon nitride film 104 by CVD. Thereafter, a photoresist pattern 106 is formed on the silicon oxide film 105 by lithography.

Figure 8:
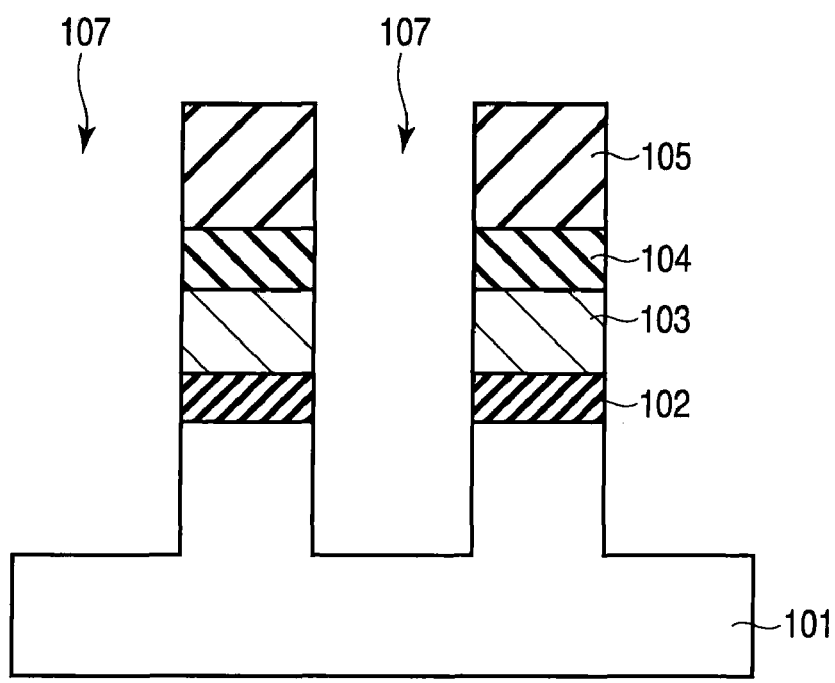

As shown in FIG. 8, the silicon oxide film 105 is etched by using the photoresist pattern 106 as a mask to form a pattern of the silicon oxide film 105. After the photoresist pattern 106 is removed, the silicon nitride film 104 is etched by using the pattern of the silicon oxide film 105 as a mask. Furthermore, the polysilicon film 103, the tunnel insulating film 102, and the semiconductor substrate 101 are etched by using the pattern of the silicon oxide film 105 as a mask. In this manner, an isolation trench 107 is formed.

Figure 9:
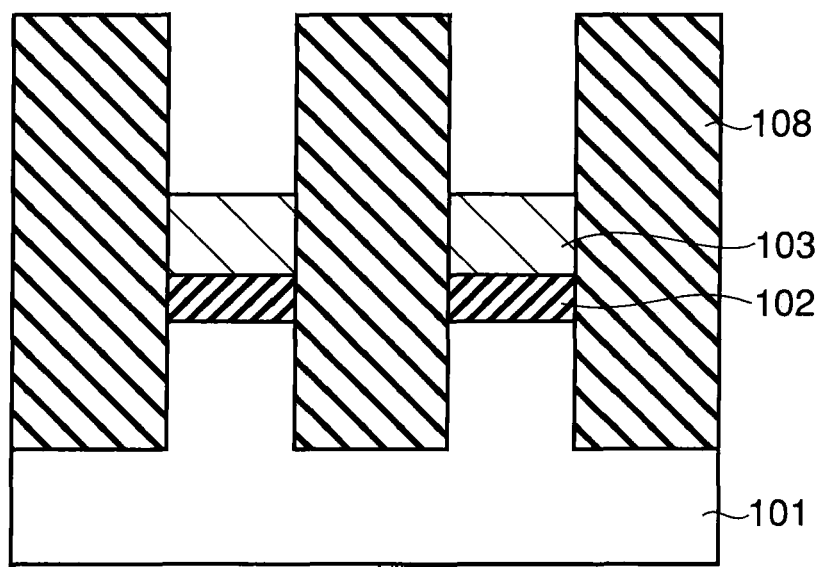

As shown in FIG. 9, an isolation insulating film 108 having a thickness of about 200 to 1500 nm is formed, and the isolation trench 107 is filled with the isolation insulating film 108. As the isolation insulating film 108, a silicon oxide film can be used. Subsequently, high-temperature thermal process in a nitrogen atmosphere or an oxygen atmosphere is performed to densify the isolation insulating film 108. Thereafter, a planarization process is performed by CMP (chemical mechanical polishing). At this time, the silicon nitride film 104 functions as a stopper of the CMP. Furthermore, the silicon nitride film 104 is removed.

Figure 10:
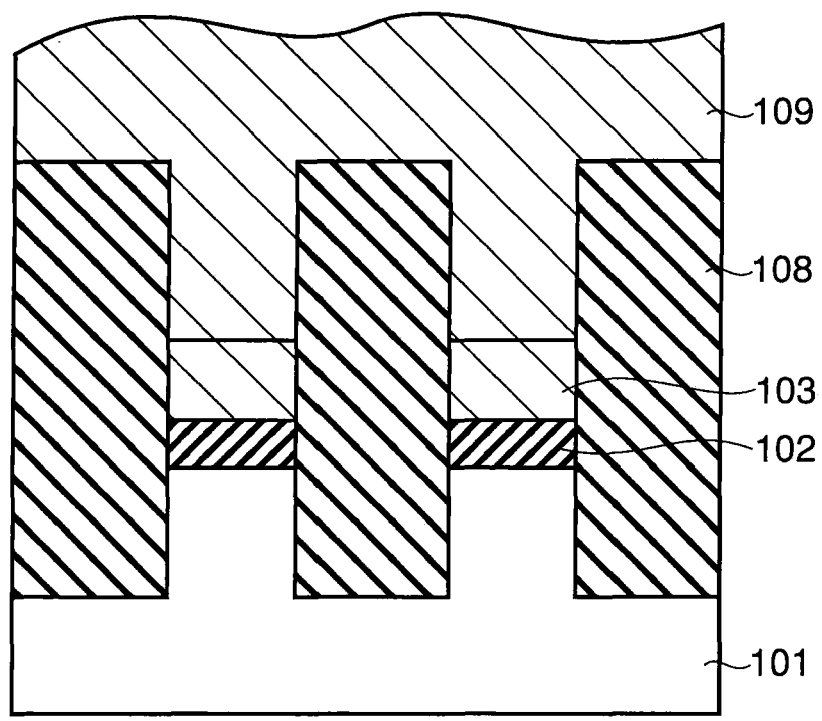

As shown in FIG. 10, a polysilicon film 109 is formed on the entire surface. The polysilicon film 109 serves as a part of a floating gate electrode film (upper layer portion of the floating gate electrode film).

As shown in FIG. 11, the polysilicon film 109 is planarized by CMP. At this time, the isolation insulating film 108 functions as a stopper of the CMP. Subsequently, selective etching is performed to etch back the isolation insulating film 108.

This etch back process partially exposes a side surface of a floating gate electrode film 110 formed of the polysilicon films 103 and 109.

As shown in FIG. 12, by LPCVD (low pressure chemical vapor deposition) or ALD (atomic layer deposition), a silicon oxide film 111 having a thickness of about 3 to 5 nm is formed on an exposed surface of the floating gate electrode film 110 and the isolation insulating film 108. Subsequently, a silicon film 112 having a thickness of about 2 to 5 nm is formed on the silicon oxide film 111 by LPCVD. Furthermore, by LPCVD or ALD, a silicon oxide film 113 having a thickness of about 3 to 5 nm is formed on the silicon film 112.

Figure 13:
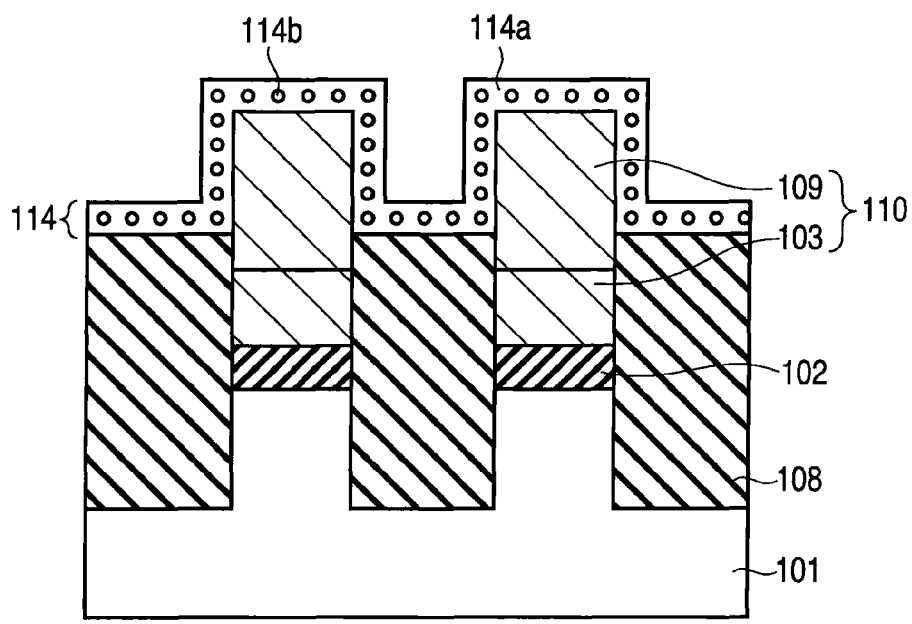

As shown in FIG. 13, thermal treatment at a temperature of about 700 to 1000° C. is performed in an inert gas atmosphere or a nitrogen gas atmosphere. By the thermal treatment, silicon atoms contained in the silicon film 112 are aggregated to form a silicon nano-crystal. As a result, an inter-electrode insulating film 114 including a main insulating film 114a formed of a silicon oxide film and nano-particles 114b formed of silicon nano-crystals can be obtained. In the embodiment, the thermal treatment is performed after the silicon oxide film 111, the silicon film 112, and the silicon oxide film 113 are formed. However, after the silicon oxide film 111 and the silicon film 112 are formed, the thermal treatment may be performed before the silicon oxide film 113 is formed. In this case, the nano-particles 114b formed of a silicon nano-crystal can be formed.

Figure 14:
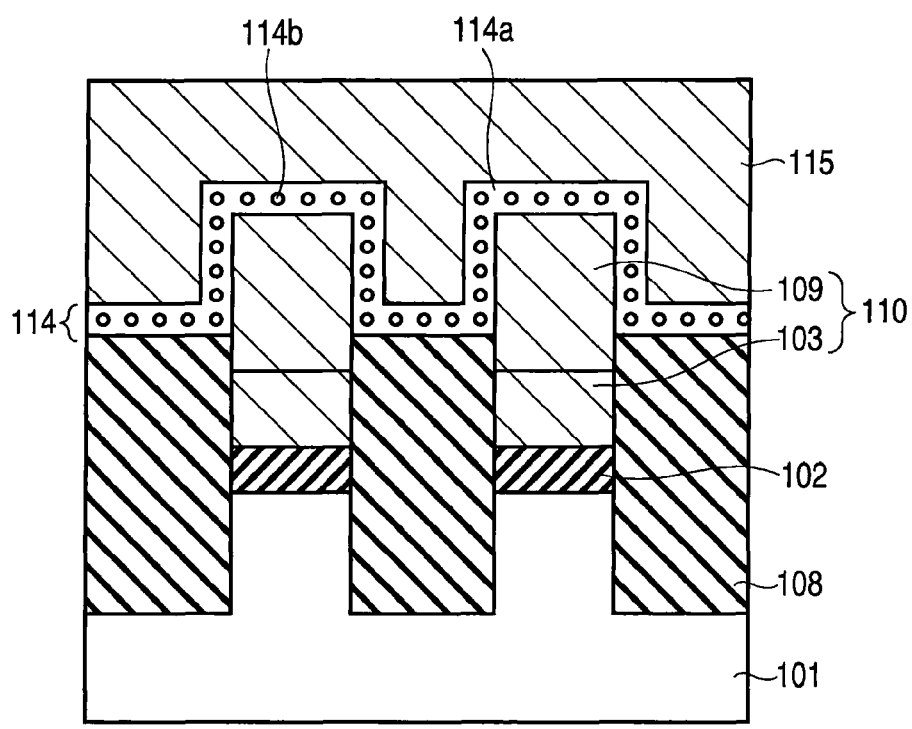

As shown in FIG. 14, a polysilicon film is formed as a control electrode film 115 on the inter-electrode insulating film 114 by CVD. Subsequently, a silicon oxide film (not shown) serving as a hard mask is formed on the control electrode film 115. Furthermore, a photoresist pattern (not shown) is formed on the silicon oxide film by photolithography. Subsequently, the silicon oxide film is etched by using the photoresist pattern as a mask to form a hard mask pattern. After the photoresist pattern is removed, by using the hard mask pattern as a mask, the control electrode film 115, the inter-electrode insulating film 114, the floating gate electrode film 110, and the tunnel insulating film 102 are etched. In this manner, a pattern of a control electrode and a pattern of a floating gate electrode are formed.

In the subsequent steps, although not especially shown, an insulating film (corresponding to the insulating film 19 in FIGS. 1 and 2) is formed on a surface of a gate structure formed of the control electrode film 115, the inter-electrode insulating film 114, the floating gate electrode film 110, and the tunnel insulating film 102. Furthermore, formation of an interlayer insulating film (corresponding to the interlayer insulating film 20 shown in FIGS. 1 and 2), formation of wires (not shown), and the like are performed. As a result, a nonvolatile semiconductor memory device as shown in FIGS. 1 and 2 is obtained.

In the manufacturing method described above, a stack film including the silicon oxide film 111, the silicon film 112, and the silicon oxide film 113 is formed in the step in FIG. 12, and thermal treatment in the step in FIG. 13 is performed to form nano-particles 114b formed of a silicon nano-crystal. By using the method, nano-particles can be easily and reliably formed. As a result, a nonvolatile memory device which can sufficiently suppress a leakage current through the inter-electrode insulating film and which is excellent in characteristic and reliability can be formed.

In the manufacturing method, formation of a silicon nano-crystal as the nano-particles 114b has been described. However, even though another semiconductor material (silicon (Si), germanium (Ge), or SiGe) is used, nano-particles formed of a nano-crystal can be obtained by using the same method as described above (method described in FIGS. 12 and 13).

In the step in FIG. 12, the silicon film 112 doped with an impurity element (B, Al, In, P, As, Sb, or the like) (generally speaking, a semiconductor film doped with an impurity element) may be formed. In this case, the nano-particles 114b doped with the impurity element are formed by the thermal treatment in FIG. 13. When B, Al, or In is doped, a work function of the nano-particles 114b increases. For this reason, electrons trapped by the nano-particles 114b are difficult to be detrapped, and a charge retention characteristic can be more improved. When P, As, or Sb is doped, silicon is more easily aggregated by the thermal treatment in FIG. 13, and a nano-crystal can be more reliably formed.

Even though metal nano-particles are formed as the nano-particles 114b, metal nano-particles formed of a nano-crystal can be obtained by using the same method as described above (method described in FIGS. 12 and 13). More specifically, in the step in FIG. 12, in place of the silicon film 112, a metal film (Hf film, Zr film, Ti film, Ta film, or the like) is formed by sputtering. Thereafter, the thermal treatment in the step in FIG. 13 is performed, and metal nano-particles formed of a nano-crystal can be obtained.

Even though insulating nano-particles are formed as the nano-particles 114b, insulating nano-particles formed of a nano-crystal can be obtained by using the same method as described above (method described in FIGS. 12 and 13). More specifically, in the step in FIG. 12, in place of the silicon film 112, an insulating film (HfSiO film, HfSiON film, HfAlO film, $HfO_2$ film, $ZrO_2$ film, $TiO_2$ film, $Ta_2O_5$ film, or the like) is formed by MOCVD or ALD. Thereafter, thermal treatment is performed in the step in FIG. 13, thereby, insulating nano-particles formed of a nano-crystal can be obtained.

In the manufacturing method, formation of a silicon oxide film as the main insulating film 114a has been described. However, even though another insulating film (silicon nitride film, silicon oxynitride film, aluminum oxide film ($Al_2O_3$ film), or the like) is used, the same method as described above (method described in FIGS. 12 and 13) can be used.

When the structure as shown in FIG. 6 is formed, the following method can be used.

In the step in FIG. 12, after the silicon oxide film 111 is formed, the surface of the silicon oxide film 111 is exposed to a plasma. For example, the surface of the silicon oxide film 111 is exposed to an Ar plasma atmosphere or an $Ar/O_2$ mixed plasma atmosphere. In this plasma process, at a corner (corner defined by the upper surface and the side surface of the floating gate electrode film 110 and corner defined by the side surface of the floating gate electrode film 110 and the upper surface of the isolation insulating film 108), an electric field is concentrated. For this reason, a relatively large number of adsorption sites are present at the corner. Therefore, when the silicon film 112 is formed on the silicon oxide film 111, an incubation time (time until adsorption begins) is shortened at the corner. As a result, the thickness of the silicon film 112 is larger at the corner than at the other portions. Thereafter, the silicon oxide film 113 is formed on the silicon film 112.

The thermal treatment is performed in the step in FIG. 13. As described above, since the thickness of the silicon film 112 is larger at the corner than at the other portions, the density of the silicon nano-particles 114b can be increased at the corner. As a result, as shown in FIG. 6, the density of the nano-particles 15b at the corner of the inter-electrode insulating film 15 can be made higher than the density of the nano-particles 15b at a portion other than the corner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a tunnel insulating film formed on a semiconductor substrate;
   a floating gate electrode formed on the tunnel insulating film;
   an inter-electrode insulating film formed on the floating gate electrode; and
   a control gate electrode formed on the inter-electrode insulating film,
   wherein the inter-electrode insulating film includes a main insulating film and a plurality of nano-particles in the main insulating film, and the main insulating film is formed of an amorphous film.

2. The semiconductor device according to claim 1, wherein said plurality of nano-particles are isolated from each other.

3. The semiconductor device according to claim 1, wherein a density of the nano-particles in a film thickness direction of the inter-electrode insulating film is higher at a central portion of the inter-electrode insulating film than at a portion near an upper surface of the inter-electrode insulating film and at a portion near a lower surface of the inter-electrode insulating film.

4. The semiconductor device according to claim 1, wherein a density of the nano-particles at a corner of the inter-electrode insulating film is higher than a density of the nano-particles at a portion other than the corner of the inter-electrode insulating film.

5. The semiconductor device according to claim 1, wherein the nano-particles are formed of nano-crystals.

6. The semiconductor device according to claim 1, wherein the nano-particle has a diameter of 5 nm or less.

7. The semiconductor device according to claim 1, wherein the nano-particles are formed of a semiconductor.

8. The semiconductor device according to claim 7, wherein the semiconductor is selected from silicon, germanium, and SiGe.

9. The semiconductor device according to claim 7, wherein the semiconductor is doped with an impurity element.

10. The semiconductor device according to claim 1, wherein the nano-particles are made of a conductor.

11. The semiconductor device according to claim 1, wherein the nano-particles are formed of a metal.

12. The semiconductor device according to claim 11, wherein the metal is selected from Hf, Zr, Ti and Ta.

13. The semiconductor device according to claim 1, wherein the nano-particles are made of an insulator.

14. The semiconductor device according to claim 1, wherein the nano-particles are made of a material selected from a metal oxide, a metal nitride, and a metal oxynitride.

15. The semiconductor device according to claim 14, wherein the metal oxide and the metal oxynitride are selected from a hafnium silicon oxide, a hafnium silicon oxynitride, a hafnium aluminum oxide, a hafnium oxide, a zirconium oxide, a titanium oxide, and a tantalum oxide.

16. The semiconductor device according to claim 1, wherein the main insulating film is made of at least one of a silicon oxide film, a silicon nitride film, a silicon oxynitride film, and an aluminum oxide film.

* * * * *